(12) United States Patent
Yang et al.

(10) Patent No.: US 6,706,638 B2
(45) Date of Patent: Mar. 16, 2004

(54) METHOD OF FORMING OPENING IN DIELECTRIC LAYER

(75) Inventors: Yun-Kuei Yang, Tai-Chung (TW); Yi-Ming Chang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/761,923

(22) Filed: Jan. 17, 2001

(65) Prior Publication Data

US 2003/0003761 A1 Jan. 2, 2003

(30) Foreign Application Priority Data

Aug. 11, 2000 (TW) .......................... 89116207 A

(51) Int. Cl.⁷ ............................ H01L 21/302
(52) U.S. Cl. ............... 438/706; 438/449; 438/638; 438/710; 438/712
(58) Field of Search ................ 438/438, 449, 438/624, 638, 706, 710, 712, 713, 738

(56) References Cited

U.S. PATENT DOCUMENTS 6,140,244 A * 10/2000 Violette ................. 438/705
6,303,447 B1 * 10/2001 Chhagan et al. ......... 438/299
6,326,300 B1 * 12/2001 Liu et al. ............... 438/638
6,350,679 B1 * 2/2002 McDaniel et al. ....... 438/634

\* cited by examiner

*Primary Examiner*—Lan Vinh
(74) *Attorney, Agent, or Firm*—J. C. Patents

(57) ABSTRACT

A method of forming openings in the dielectric layer. The method includes an ion implantation step to reduce a lateral etching in a chemical vapor etching step, and to provide a high etching selectivity ratio of the dielectric layer to a mask. The dry etching process is partially substituted by the chemical vapor etching step, so that an opening having a straight profile is formed in the dielectric layer. Consequently, problems, such as loss of critical dimension and striation of the opening caused by loss of the mask can be effectively ameliorated.

15 Claims, 6 Drawing Sheets

METHOD OF FORMING OPENING IN DIELECTRIC LAYER

CROSS-REFERENCE TO RELATED APPLICATION

This application claims the priority benefit of Taiwan application serial no. 89116207, filed Aug. 11, 2000.

BACKGROUND OF THE INVENTION

1. Field of the Invention

The present invention relates to a semiconductor manufacturing process. More particularly, the present invention relates to a method of forming opening in a dielectric layer with an ion implantation step.

2. Description of the Related Art

In the fabrication processes for a deep contact window, deep trench and hard mask, it is necessary to remove a thicker portion of the oxide layer by etching. However, a thickness of the photoresist has to be reduced in order to satisfy a resolution requirement in a photolithographic process. So, if a dry etching process is adopted throughout the whole fabrication process, a critical dimension loss usually occurs as a result of photoresist loss when the plasma is used in the dry etching process. Since the photoresist is also etched by the plasma in the dry etching process, an increased etching of the oxide layer means more photoresist is etched, resulting a more significant photoresist loss. FIG. 1A is a diagram illustrating a thickness of the photoresist as well as a profile and critical dimension of a photoresist opening prior to etching. An oxide layer 20 is formed on the substrate 10, followed by forming a photoresist layer 26 on the oxide layer 20. The photoresist layer is patterned to form a photoresist opening 24 having a straight profile on the oxide layer 20. During the process for forming a via opening 28, a relatively thick portion of the oxide layer 20 together with a portion of the photoresist layer 26 are removed in the dry etching process, leading to a loss of photoresist layer 26. However, such a loss of the photoresist layer 26 produces a tapered profile of the photoresist layer, which further results a rugged edge for the via opening 28 with a slanting profile in the dry etching process. Therefore, the slanting profile contributes a significant loss of the critical diminution for the via opening 28. This is shown in FIG. 1B, which illustrates the result after the dry etching process but before the photoresist is stripped from the oxide layer.

When the loss of the photoresist becomes extremely severe, problems, such as striation can result. FIG. 2 is a diagram illustrating the striation and loss of critical dimension when a substantial portion of the photoresist layer is removed together with the etching of the thick portion of the oxide layer. A substrate 10 is provided with a doped oxide layer 12 formed thereon. An undoped oxide layer 14 is then formed on the doped oxide layer 12, while an opening 18 is formed in the doped oxide layer 12 and the undoped oxide layer 14 for exposing the substrate 10. The opening 18 does not have a straight profile, but rather the opening has a rugged edge, as well as an enlarged bottom of the opening 18 and striations 16 as a result of the critical dimension loss.

In general, during a dry etching step for oxide, an etching rate for the photoresist is about 800 Å/min, while an etching selectivity ratio of the oxide to the photoresist is about 6. If the etching rate of the photoresist can be reduced or the etching is more selected to the oxide than the photoresist during the dry etching process, the loss of the photoresist as described above can be ameliorated. Since the plasma is used in the dry etching process, the etching selectivity ratio of the oxide to the photoresist can not be significantly increased. Therefore, when a thicker portion of the oxide layer is etched, the loss of the photoresist can not be effectively reduced. In order to increase the etching selectivity ratio of the oxide to the photoresist, the dry etching process can be partially substituted with a wet etching step. Generally, when the wet etching step is performed on the oxide layer, the etching rate for the photoresist is about of 10 Å/min, and an etching selectivity ratio of the oxide to the photoresist is as high as 80. Accordingly, chemical wet etching step has been known to have a high etching selectivity ratio of the oxide to the photoresist and to reduce the loss of the photoresist. However, the wet etching step can cause a severe lateral etching which leads to formation of the opening with a slanting profile. Therefore, such method is not applicable to an actual fabrication process.

SUMMARY OF THE INVENTION

The present invention provides a method of forming openings in a dielectric layer with an ion implantation step. The dielectric layer includes at least a dielectric layer, with a top dielectric layer being an undoped dielectric layer. By performing the ion implantation step, it provides a low lateral etching rate and a high etching selectivity ratio of oxide to photoresist in the chemical vapor etching step. With the low etching rate for the photoresist, loss of photoresist during the etching step is minimized and the problems of critical dimension loss and striations are prevented. For that reason, the dry etching process is partially substituted by the chemical vapor etching.

As embodied and broadly described herein, the invention provides a process whereby an undoped dielectric layer is formed on a substrate and a mask is formed on the undoped dielectric layer. The mask has an opening that exposes a part of the undoped dielectric layer. The undoped dielectric layer can be either an oxide layer or a silicon nitride layer, for example. With the mask, an ion implantation step is performed to implant ions into the undoped dielectric layer located below the opening. A doped region is thus formed, wherein the depth of the doped region does not exceed the thickness of the undoped dielectric layer. Still with the mask, a chemical vapor etching procedure is performed to etch the doped region. A dry etching procedure is next performed with the same mask, so that the remaining undoped dielectric layer located below the doped region is etched away, thereby exposing a part of the substrate. Next, the mask is either removed or not removed depending on the manufacturing requirement.

In the above-described procedure, the chemical vapor etching has a greater etching rate for the doped region than that for the undoped region. Thus, the lateral etching rate for the doped region is relatively reduced in the chemical vapor etching step, effectively preventing the lateral etching of the chemical vapor etching. According to the present invention, by performing the ion implantation step, the lateral etching of the chemical vapor etching can be reduced, and a straight profile is obtained through the etching. Moreover, the chemical vapor etching has a low etching rate for the mask and high etching selectivity of the dielectric layer to the mask. Therefore, if the dry etching procedure is partially substituted by the chemical vapor etching, the mask loss during etching is reduced. Furthermore, the problems of critical dimension loss and striation are avoided.

It is to be understood that both the foregoing general description and the following detailed description are exemplary, and are intended to provide further explanation of the invention as claimed.

DESCRIPTION OF THE PREFERRED EMBODIMENTS

Figure 1A:
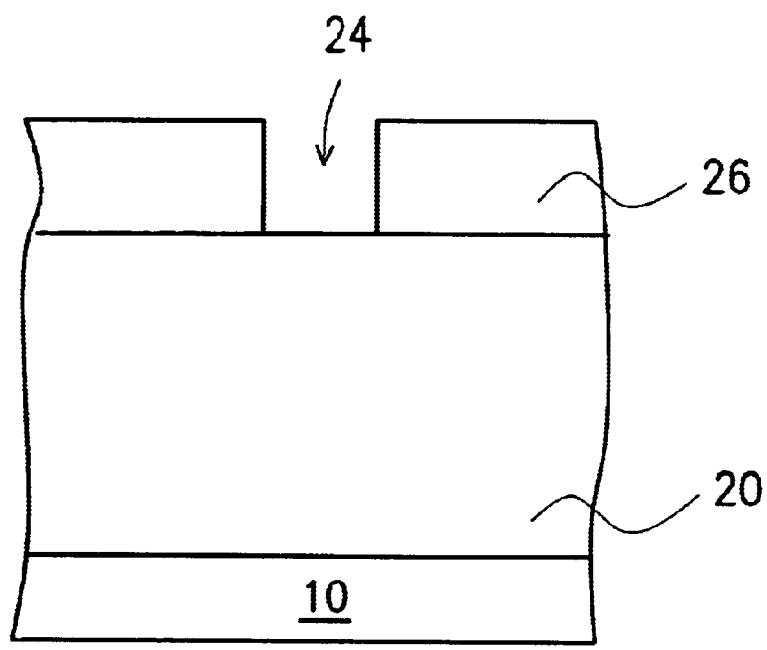
FIG. 1A is a schematic diagram in cross-sectional view, illustrating a thickness of a photoresist, a profile and critical dimension of a photoresist opening prior to etching.
Figure 1B:
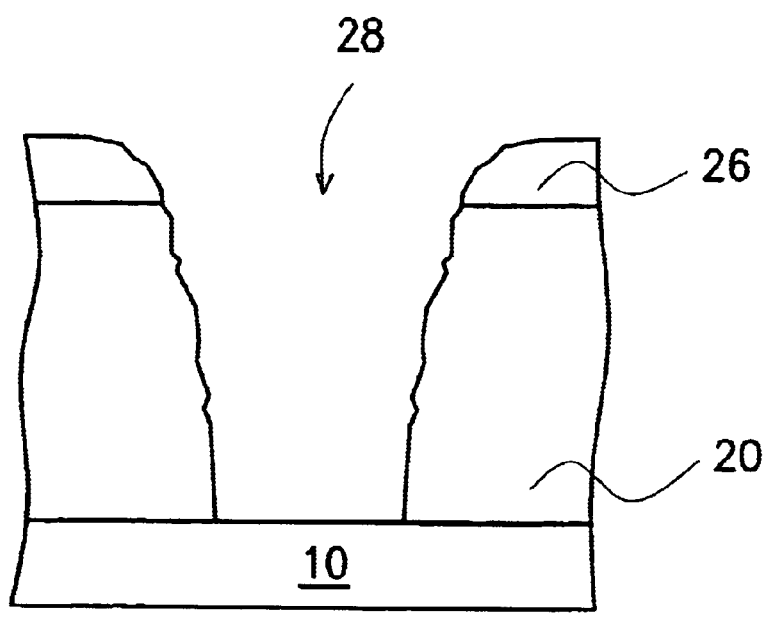
FIG. 1B is a schematic diagram in cross-sectional view, illustrating the result after etching a thick portion of the oxide layer and before stripping the photoresist.
Figure 2:
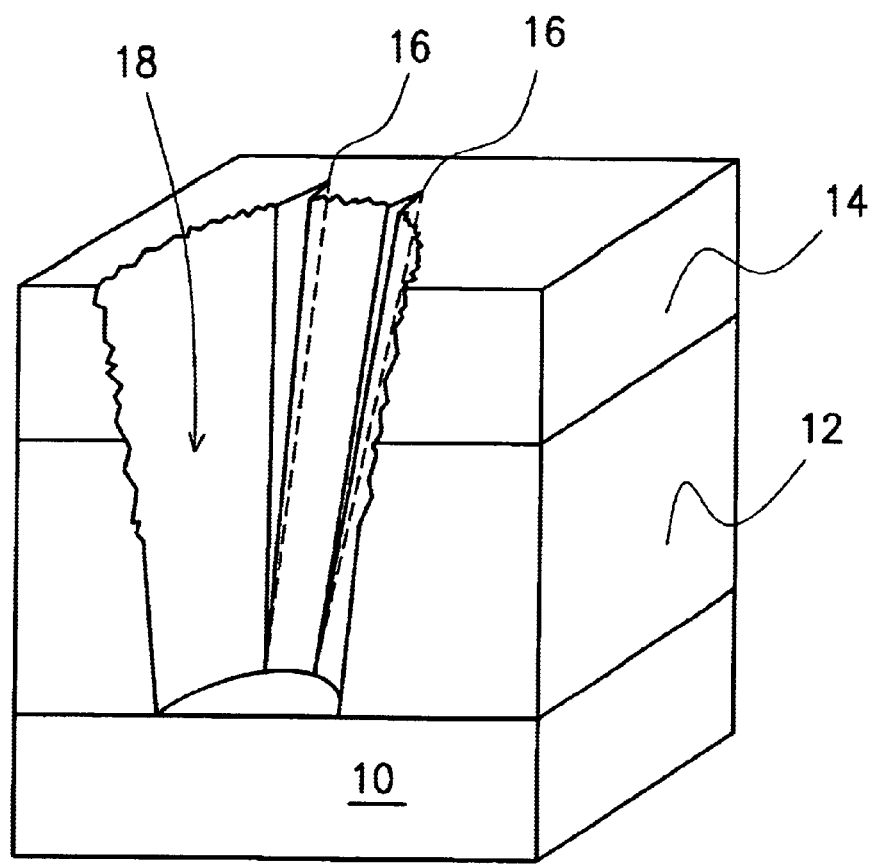
FIG. 2 is a three-dimensional diagram in cross-sectional view, illustrating a conventional dry etching process which results problems of critical dimension loss and striation of the opening.

The present invention provides a procedure using ion implantation to form openings in a dielectric layer. The dielectric layer includes, at least one dielectric layer, with a top dielectric layer being an undoped dielectric layer. The first embodiment is described using hydrofluoride as a gas source of the chemical vapor etching and with a photoresist layer serving as a mask. The undoped dielectric layer includes an undoped oxide layer, while a doped dielectric layer serves as a doped oxide layer. A hydrofluoric chemical vapor etching has a low etching rate for the photoresist layer, for example, about of 50 Å/min., and preferably as low as about of 10 Å/min. The etching selectivity ratio of oxide to photoresist is high, for example, greater than 20, and preferably greater than 80.

FIGS. 3A to 3E are schematic diagrams in cross-sectional view, illustrating a method of forming opening in the dielectric layer with the ion implantation step according to the preferred embodiment of the present invention. Firstly, referring to FIG. 3A, a substrate 30, such as semiconductor substrate, which may already be formed with finished component structures (not shown), is provided. A doped oxide layer 32 is deposited on the substrate 30. The doped oxide layer 32 includes one of the following, for example: BSG, BPSG, a tetra-ethly-ortho-silicate (TEOS) layer doped with boron ions, a TEOS layer doped with phosphorus ions, a TEOS layer doped with boron and phosphorus ions. The doped oxide layer has a thickness of about 3000 Å to 20000 Å, and preferably has a thickness of 7000 Å to 15000 Å. An undoped oxide layer 34 is deposited on the doped oxide layer 32, wherein the undoped oxide layer 34 includes, for example: either silicon dioxide or TEOS. The undoped oxide layer has a thickness of about 300 Å to 5000 Å, and preferably has a thickness of 1000 Å to 3000 Å. The undoped oxide layer 34 is coated with a photoresist 36. After a photolithographic process is performed, an opening 38 is formed in the photoresist 36 to expose a portion of the undoped oxide layer 34.

Figure 3A:
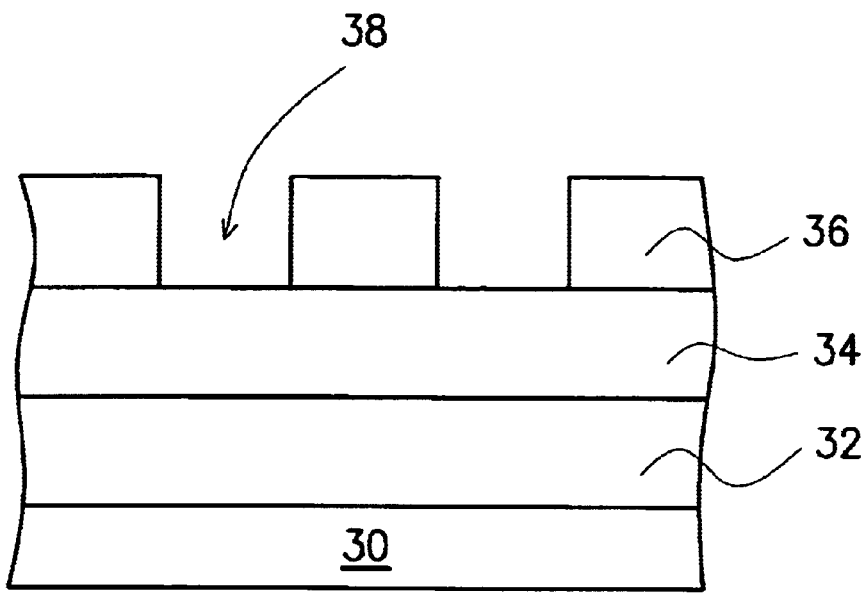
FIGS. 3A to 3E are schematic diagrams in cross-sectional view, illustrating a method of forming opening in the dielectric layer with the ion implantation step according to the preferred embodiment of the present invention.
Figure 3B:
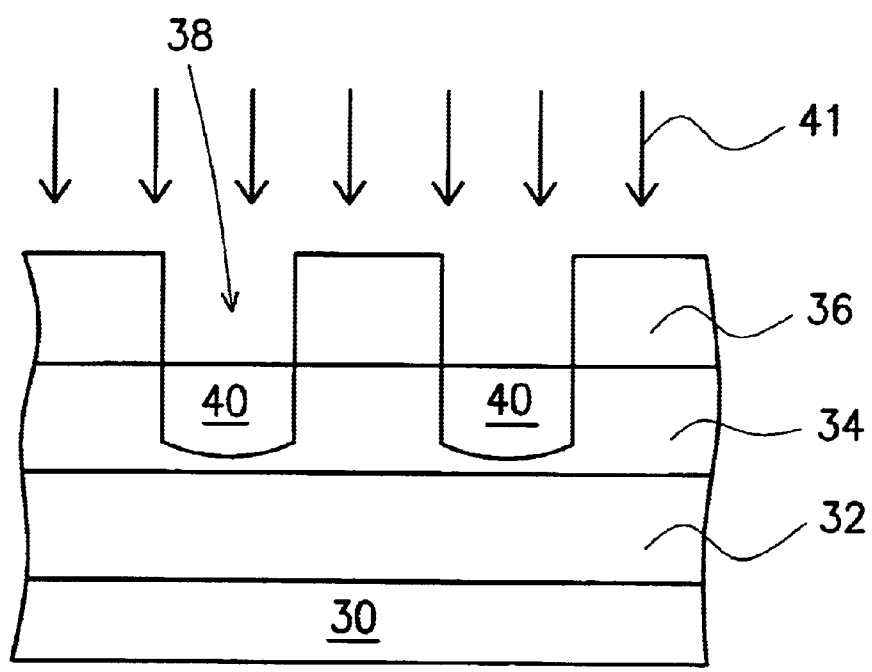

Next, referring to FIG. 3B, an ion implantation step 41 is performed for implanting ions into a portion of the undoped oxide layer 34 exposed by the opening 38, so that an doped region 40 is formed in a portion of the undoped oxide layer 34 below the opening 38. Preferably, the ions implanted in the undoped dielectric layer include boron (B), phosphorus (P), and arsenic (As), but the type of implanted ions should not be limited to those disclosed herein. A depth of the doped region 40 does not exceed a thickness of the undoped oxide layer 34. For example, the depth of the doped region 40 is at least 70% of the thickness of the undoped oxide layer 34.

Figure 3C:
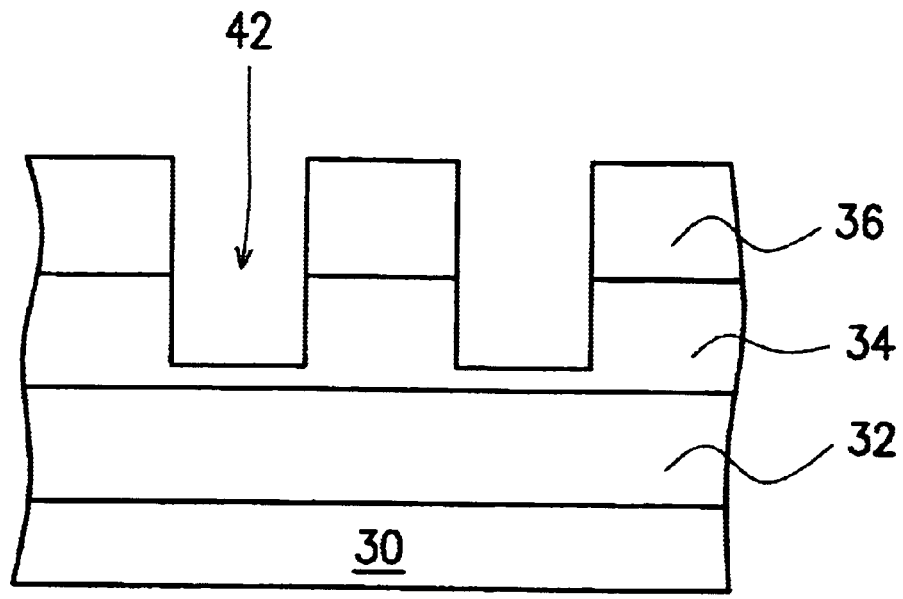

Referring the FIG. 3C, a hydrofluoric chemical vapor etching step is performed, with the photoresist 36 serving as an etching mask, so that the doped region 40 is removed to form an opening 42 in the undoped oxide layer 34. However, the opening 42 has a depth which does not exceed a thickness of the undoped oxide layer 34. For example, the depth of the opening 42 is at least 70% of the thickness of the undoped oxide layer 34. The etching rate for the B doped TEOS or P doped TEOS is fast, for example, 1000 to 5000 Å/min., with a preferable rate of about 3000 Å/min. On the other hand, the etching rate for the undoped TEOS is slow, for example, from about 1 Å to 100 Å/min., with a preferable rate of 10 Å/min.

By contrast, in the prior art, the oxide layer undergoes dry etching, the etching rate for the photoresist is about 800 Å/min., the etching selectivity ratio of oxide to photoresist is 6. Moreover, in the chemical wet etching of the prior art, the etching rate for the B doped TEOS or P doped TEOS is about 5000 Å/min., and the etching rate for the undoped TEOS layer is about 7000 Å/min. Since the undoped oxide layer 34 and the doped region 40 have very similar etching rates in the chemical wet etching, the lateral etching becomes severe when chemical wet etching step is performed, even if an ion implantation step 41 is added.

According to the present invention, the hydrofluoric vapor etching step provides a high etching selectivity ratio of oxide to photoresist to effectively prevent damage to the photoresist. In addition, the etching step provides a low lateral etching rate, that is, a reduced etching rate for the undoped TEOS. Thus, a straight profile of the opening can be obtained.

Figure 3D:
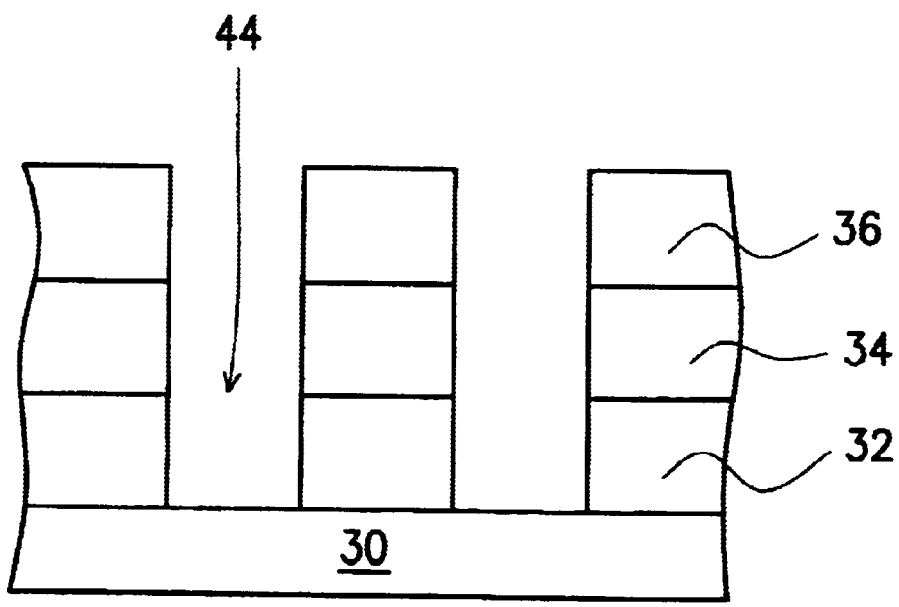

Referring to FIG. 3D, the process is continued with dry etching step to etch down the remaining oxide layer until an opening 44 is formed in the oxide layer to expose the substrate 30.

Figure 3E:
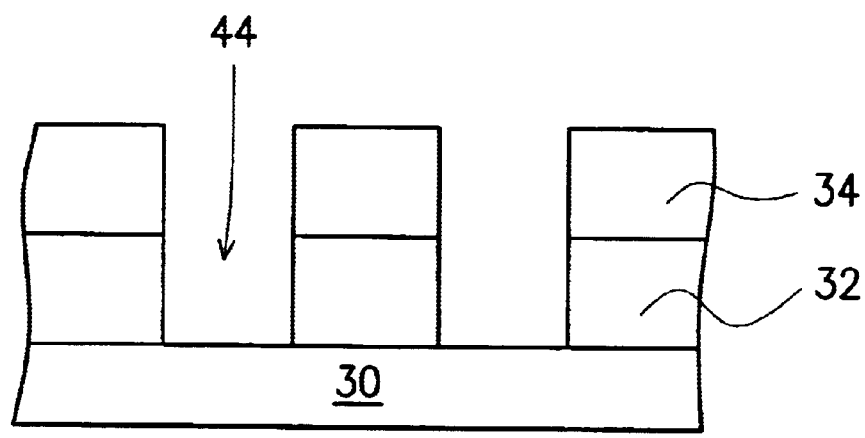

Referring to FIG. 3E, after a step of stripping the photoresist is performed, the process of forming the opening 44 in the dielectric layer is completed.

Figure 4:
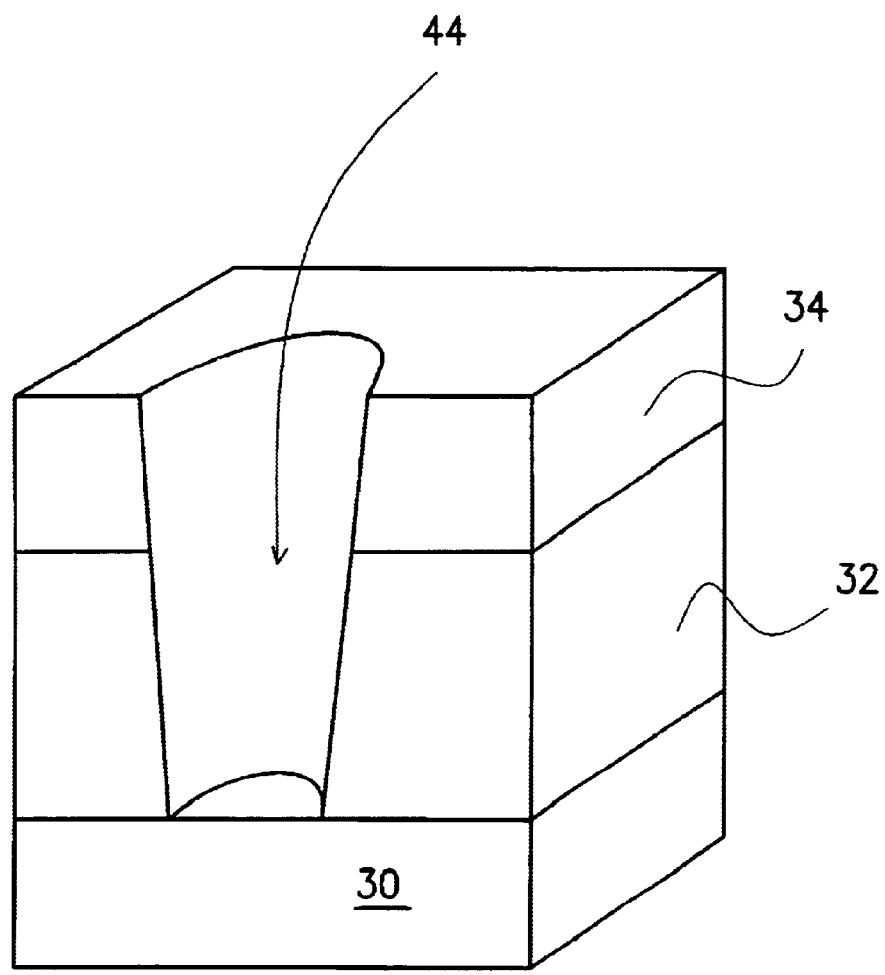
FIG. 4 is a three-dimensional diagram in cross-sectional view, illustrating an opening formed in the dielectric layer according to the preferred embodiment of the present invention.

FIG. 4 is a three-dimensional diagram in cross-sectional view, illustrating an opening formed in the dielectric layer according to the preferred embodiment of the present invention. Since the hydrofluoric chemical vapor etching has a high selectivity ratio of oxide to photoresist, a portion of the dry etching is replaced; photoresist 36 damage during etching can be minimized, and prevents the problems such as loss of critical dimension and striation of the opening. Also, when the ion implantation region 40 is removed by the hydrofluoric vapor etching, the lateral etching is effectively prevented. Accordingly, the opening 44 has a straight profile in the oxide layers 32, 34.

The above-described embodiments illustrates the dielectric layer made up of two component dielectric layers, wherein an upper layer is an undoped dielectric layer, and a lower layer is an doped dielectric layer. The present invention is also applicable to the dielectric layer solely made up of an undoped dielectric layer. Referring to FIGS. 3 and 4, this also means that the oxide layers 32, 34 can both be undoped dielectric layers, and can be taken as a single undoped dielectric layer. The depth of the doped region 40 does not exceed the thickness of the single undoped dielectric layer 34. For example, the depth of the ion implantation region as at least 50% of the thickness of the undoped dielectric layer. The depth of the opening 42 formed by chemical vapor etching does not exceed the thickness of the single undoped dielectric layer 34. For example, the depth of the opening 42 is at least 50% of the thickness of the undoped dielectric layer.

The dielectric layer in the present invention includes, for example, either an oxide or silicon nitride layer. When the dielectric layer is silicon nitride, the dielectric layer includes undoped silicon nitride or doped silicon nitride, for example.

Even though the opening is illustrated either as an interface window or a contact window, the opening in the present invention is not limited to an interface window or a contact window. When the mask is a photoresist, the photoresist must be removed after etching. But if the mask is made of materials other than photoresist, the mask can either be removed or not removed, depending on the manufacturing requirement.

In summary, the method of forming the opening in the dielectric layer provides several advantages as follow. The chemical vapor etching step provides a higher etching selectivity ratio of the dielectric layer to the mask, so that the conventional dry etching process can be partially substituted by the chemical vapor etching step, making mask loss during etching a minimum. Therefore, problems, such as loss of critical dimension and striation of the opening can be prevented. By performing the ion implantation step, the anisoptropism of chemical vapor etching is increased to reduce a lateral etching, thereby a straight profile of the opening is obtained. The present invention can also be applied in the method of fabricating contact windows and deep trench.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming an opening in a dielectric layer, comprising:

providing a substrate;

forming a doped dielectric layer on the substrate;

forming a undoped dielectric layer on the doped dielectric layer;

forming a mask on the undoped dielectric layer, wherein the mask has a first opening therein for exposing a portion of the undoped dielectric layer;

performing an ion implantation step with the mask on the undoped dielectric layer, so that a doped region is formed in the exposed portion of the undoped dielectric layer below the first opening, leaving the exposed portion of the undoped dielectric layer below the doped region undoped, wherein a depth of the doped region does not exceed a thickness of the undoped dielectric layer;

performing a chemical vapor etching step with the mask on the undoped dielectric layer to remove the doped region, thereby forming a second opening in the undoped dielectric layer, wherein the second opening exposes the exposed portion of the undoped dielectric layer below the doped region; and performing a dry etching step with the mask on the undoped dielectric layer, so that the exposed portion of the undoped dielectric layer below the doped region and a portion of the doped dielectric layer below the second opening are removed to expose a portion of the substrate.

2. The method of claim 1, wherein the doped dielectric layer includes a tetra-ethyl-ortho-silicate (TEOS) layer doped with boron (B) ions.

3. The method of claim 1, wherein the doped dielectric layer includes a TEOS layer doped with phosphorus (P) ions.

4. The method of claim 1, wherein the doped dielectric layer includes a TEOS layer doped with boron (B) and phosphorus (P) ions.

5. The method of claim 1, wherein the doped dielectric layer includes a doped silicon nitride layer.

6. The method of claim 1, wherein the undoped dielectric layer includes an oxide layer.

7. The method of claim 1, wherein the undoped dielectric layer includes a silicon nitride layer.

8. The method of claim 1, wherein the step of performing the ion implantation step includes implanting boron (B) ions in the exposed portion of the undoped dielectric layer below the first opening.

9. The method of claim 1, wherein the step of performing the ion implantation step includes implanting phosphorus (P) ions in the exposed portion of the undoped dielectric layer below the first opening.

10. The method of claim 1, wherein the step of performing the ion implantation step includes implanting arsenic (As) ions in the exposed portion of the undoped dielectric layer below the first opening.

11. The method of claim 1, wherein the chemical vapor etching step includes hydrofluoric vapor etching step.

12. The method of claim 1, wherein the depth of the doped region is at least 70% of the thickness of the undoped dielectric layer.

13. The method of claim 1, wherein the depth of the second opening region is at least 70% of the thickness of the undoped dielectric layer.

14. The method of claim 1, wherein the mask includes a photoresist.

15. The method of claim 1, further includes a stripping step for removing the mask after the dry etching step.

* * * * *